United States Patent [19]

Satyanarayana et al.

[11] Patent Number: 5,977,832

[45] Date of Patent: Nov. 2, 1999

[54] METHOD OF BIASING AN MOS IC TO OPERATE AT THE ZERO TEMPERATURE COEFFICIENT POINT

[75] Inventors: Srinagesh Satyanarayana, Brewster; Pawan Gogna, Yorktown Heights, both of N.Y.

[73] Assignee: Philips Electronics North America Corporation, New York, N.Y.

[21] Appl. No.: 08/993,135

[22] Filed: Dec. 18, 1997

[51] Int. Cl.⁶ ...................................................... H03F 1/30
[52] U.S. Cl. ......................... 330/289; 327/513; 330/296; 330/277; 330/307
[58] Field of Search ..................... 330/256, 266, 330/272, 277, 289, 296, 307; 327/512, 513

[56] References Cited

U.S. PATENT DOCUMENTS 3,882,728  5/1975  Wittinger .............................. 327/512 X

FOREIGN PATENT DOCUMENTS 2225913  6/1990  United Kingdom .

*Primary Examiner*—James B. Mullins
*Attorney, Agent, or Firm*—Steven R. Biren

[57] ABSTRACT

A method of biasing an MOS IC includes the steps of providing the IC with two MOS transistors having substantially similar characteristics and maintaining these two transistors at different temperatures. During operation of the IC, an output voltage is generated from each of the two transistors, and a bias voltage is generated as a function of the difference between the two output voltages. This bias voltage is then fed back to the gate terminals of the two MOS transistors to set the bias voltage to a steady-state level at which the circuit will operate at a zero temperature coefficient point. This bias voltage is also coupled to the gate electrodes of other transistors within the IC, to operate these transistors at the zero temperature coefficient point. An IC operated in accordance with biasing method will exhibit superior stability with variations in ambient temperature.

4 Claims, 1 Drawing Sheet

METHOD OF BIASING AN MOS IC TO OPERATE AT THE ZERO TEMPERATURE COEFFICIENT POINT

BACKGROUND OF THE INVENTION

The invention is in the field of biasing circuits for MOS integrated circuits (ICs), and relates more particularly to a method of biasing such MOS ICs to provide temperature compensation.

When the operating temperature of an MOS IC changes, various transistor parameters will also change, thus causing the bias point of the circuit to change. At a certain point, such changes may cause the circuit to operate in a less than optimum fashion, or even to cease operating in the intended manner.

Accordingly, there exists a substantial need to compensate for transistor parameter changes with changes in temperature. Although many critical circuit parameters can be made temperature independent by making them a ratio of two components, such as transistors, resistors or capacitors, of the same type, which have similar parameter variations with temperature, it is not practical or economical to use this technique for all components. As a result, circuits are typically over-designed to guarantee performance over the desired temperature range, or else an external reference component having a parameter that varies only slightly with temperature is provided, and this component is used to generate a bias condition with a minimum variation over temperature. In other cases, additional components are inserted into the circuit to compensate for parameter changes with a change in temperature.

One example of the latter form of compensation is shown in GB 2,225,913A, in which a resistor is provided in series with an MOS transistor, between its source electrode and ground, in order to make transistor operation less temperature dependent.

However, all of the prior-art temperature compensation schemes discussed above have inherent drawbacks. Thus, compensation by providing ratioed pairs of components increases the cost and complexity of the circuit, and does not fully compensate for variations with temperature, since only some components are compensated. Similarly, the use of over-design techniques also increases cost and size, and does not fully compensate for temperature variations, and the use an external reference component likewise increases cost and complexity. With reference to the specific compensation scheme of GB 2,225,913A, this technique requires that the value of the series resistor be correctly calculated based upon a precise determination of the temperature coefficients of the transistor and the resistor, so that in practice the threshold voltage of the compensated transistor is made less temperature dependent but not completely temperature independent. Furthermore, since the prior-art circuit requires the use of a resistor between the source electrode and ground, grounded-source operation is not possible. Additionally, the use of such a series resistor can limit both the gain and speed of the circuit.

Accordingly, it would be desirable to have a temperature compensation method for an MOS IC which affords excellent temperature compensation without the need for over-design, the use of redundant or ratioed components, the use of an external reference component or a series resistor in the primary circuit.

SUMMARY OF THE INVENTION

It is therefore an object of the invention to provide a high-performance temperature compensation scheme for an MOS IC which does not require the use of over-design techniques, redundant components, an external reference component or a series resistor in the primary circuit.

In accordance with the invention, this object is achieved by a biasing method in which the MOS IC is provided with two MOS transistors having substantially similar or identical characteristics, with the two transistors being maintained at different temperatures during operation of the IC. An output voltage is generated from each of the two MOS transistors, and a bias voltage is generated as a function of the difference between the output voltages of these two transistors. This bias voltage is fed back to the gate terminals of the two transistors to set the bias voltage to a steady-state level at which the circuit will operate at a zero temperature coefficient point, and this bias voltage is also coupled to the gate electrodes of other MOS transistors within the IC to operate these transistors at the zero temperature coefficient point.

In a preferred embodiment of the invention, the two MOS transistors are maintained at different temperatures by locally heating a portion of the MOS IC containing only one of the two transistors, for example by providing a voltage to a resistor located in the portion of the MOS IC containing the transistor to be maintained at a more elevated temperature.

In a further preferred embodiment of the invention, the bias voltage is generated as a function of the difference between the output voltages of the two MOS transistors by applying their output voltages to differential inputs of an amplifier and obtaining the bias voltage from an output of the amplifier.

MOS ICs biased in accordance with the method of the invention offer a significant improvement in that excellent temperature compensation is obtained by operating the circuit at the zero temperature coefficient point without the necessity for the use of over-design techniques, redundant or ratioed components, an external reference component or a series resistor in the primary circuit.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

DESCRIPTION OF THE PREFERRED EMBODIMENTS

Figure 1:
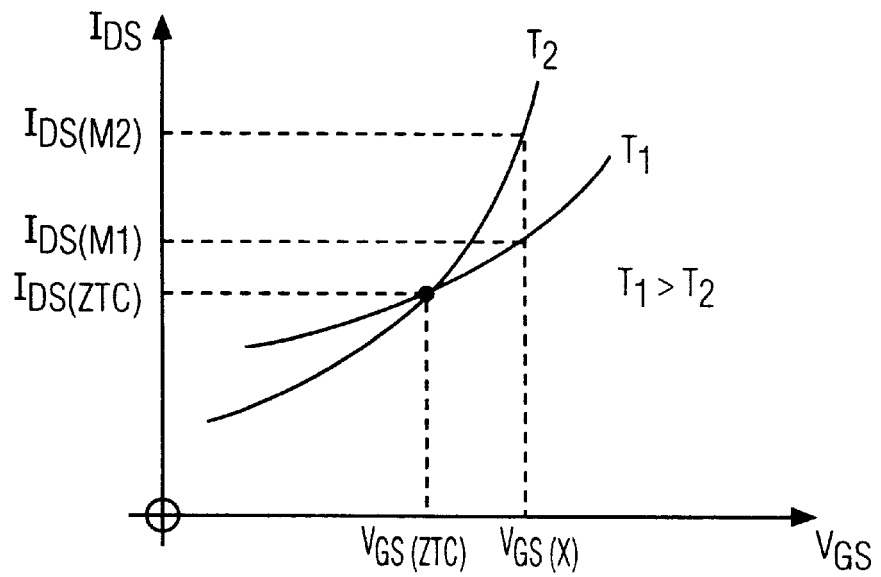
FIG. 1 shows a graph of characteristic curves representing drain-to-source current as a function of gate-to-source voltage in order to illustrate the principles underlying the invention.

In order to illustrate the principles underlying the method of the present invention, FIG. 1 shows a graph of two characteristic curves representing drain-to-source current in an MOS transistor as a function of gate-to-source voltage. FIG. 1 shows characteristic curves for MOS transistor operation at two different temperatures, $T_1$ and $T_2$, with $T_1$ being greater than $T_2$. From FIG. 1, it will be seen that biasing an MOS transistor (or two similar or identical such transistors) at an arbitrary gate to source voltage $V_{GS(X)}$ will result in a shift in the operating point with temperature, as shown by the two different drain currents $I_{DS(M1)}$ and $I_{DS(M2)}$. This shift in operating point with temperature is extremely undesirable, as it may cause the circuit to operate in less than optimum fashion, or even to cease operating entirely. In order to overcome this problem, the present invention recognizes that there is a bias point at which the curves $T_1$ and $T_2$, as well as other curves for different temperatures, will intersect. This point, known as the zero temperature coefficient point, at a gate-to-source voltage $V_{GS(ZTC)}$ as shown in FIG. 1, is the bias point at which the curves at different temperatures, such as $T_1$ and $T_2$, will intersect, such that the bias point will remain constant at a drain-to-source current $I_{DS(ZTC)}$ with variations in temperature.

Figure 2:
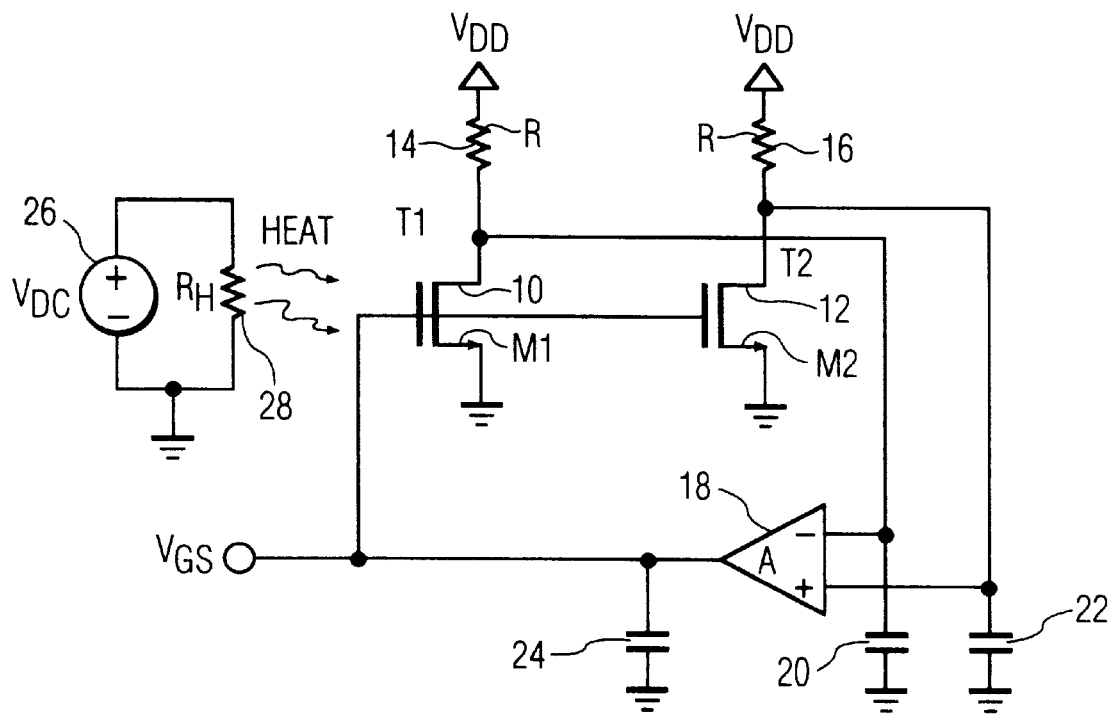
FIG. 2 shows a simplified representation of an implementation of a biasing scheme in accordance with the invention.

A simplified representation of an implementation of a biasing scheme in accordance with the invention is shown in FIG. 2. In the simplified circuit of FIG. 2, a pair of MOS transistors 10 and 12 (M1, M2) are provided with their gates connected together and their sources connected to ground. A pair of resistors 14 and 16 (R) are provided to couple the drains of transistors M1 and M2 to a source of voltage $V_{DD}$. The outputs of transistors M1 and M2, at their respective drains, are connected to the inverting and noninverting inputs of an amplifier 18 (A) with capacitors 20 and 22 being coupled from the respective amplifier inputs to ground to smooth the input signals. The gain of amplifier 18 should be large, typically above 100, to ensure accurate operation. The output of amplifier 18, smoothed by a capacitor 24, is provided to a circuit output terminal $V_{GS}$, and is also fed back to the gates of transistors 10 and 12.

In the embodiment of FIG. 2, the transistors 10 and 12 are operated at different temperatures $T_1$ and $T_2$ by providing a localized heat source, shown symbolically by a voltage source 26 ($V_{DC}$) connected to a resistor 28 ($R_H$), which generates heat to elevate the temperature of transistor 10 to a temperature T1 which is greater than the operating temperature T2 of transistor 12, located away from the heat source. It will be recognized that various methods of localized heating may be employed, such as placing transistor 10 in a portion of the IC that is hotter than the remaining portions of the circuit due to the power dissipation of adjacent components, or else by drawing more current through transistor 10 to result in a self-heating effect.

The transistors 10 and 12 may either be substantially identical transistors, in which case the resistors 14 and 16 will be of equal value, or else similar transistors with like W/L ratios, so long as they are brought to different temperatures during operation. For the circuit of FIG. 2, transistors 10 and 12 are presumed to be substantially identical.

Operation of the simplified circuit as shown in FIG. 2 may be understood with reference to the characteristic curves of FIG. 1. Assuming that the circuit of FIG. 2 starts operating at an arbitrary gate-to-source bias voltage $V_{GS(X)}$ at which the drain-to-source currents in the two identical transistors will be unequal, since they are operating at different temperatures, these different currents will create different voltage drops across the like resistors 14 and 16, thus providing a differential voltage signal to amplifier 18. Due to the high gain of amplifier 18 and the feedback connection back to the gate of the two transistors from the amplifier output, the circuit will achieve a steady-state operating condition at a gate-to-source voltage of $V_{GS(ZTC)}$, since this is the only voltage at which the two transistors will draw equal currents, thus generating equal voltages at their drains and driving the differential input of amplifier 18 to substantially zero in the steady-state condition. Thus, by means of a feedback circuit from the outputs of two transistors operating at different temperatures, through a high-gate amplifier and back to the inputs of these two transistors, a method is provided for biasing an MOS IC by generating a bias voltage at the zero temperature coefficient point.

In this manner, a temperature compensation method is provided for an MOS IC which affords excellent temperature compensation without the need for over-design, the use of redundant or ratioed components, the use of an external reference component or a series resistor in the primary circuit.

While the invention has been particularly shown and described with reference to a preferred embodiment thereof, it will be understood by those skilled in the art that various changes in form and detail may be made without departing from the spirit or scope of the invention. Thus, for example, instead of providing a gate-to-source voltage $V_{GS}$ to be used directly as a bias voltage to be used by other transistors within the MOS IC, the output of amplifier 18, at the terminal labeled $V_{GS}$ in FIG. 2 can instead be coupled to a conventional current mirror, to provide a compensated bias current to be used by other portions of the circuit. In another modification, transistors 10 and 12 may be operated in a switched, rather than a steady-state, mode in order to lower power consumption. In this case, the transistors would each provide a pulsed output to amplifier 18, which would be filtered by the capacitors 20 and 22. Finally, as noted above, different methods for operating transistor 10 at a higher temperature than that of transistor 12 are within the scope of the invention.

What is claimed is:

1. A method of biasing an MOS IC, which comprises:

providing said MOS IC with two MOS transistors having substantially similar characteristics;

maintaining said two MOS transistors at different temperatures and generating an output voltage from each of said MOS transistors during operation of the MOS IC;

generating a bias voltage as a function of the difference between the output voltages of said two MOS transistors; and feeding said bias voltage back to gate terminals of said two MOS transistors to set said bias voltage to a steady-state level at which said circuit will operate at a zero temperature coefficient point; and coupling said bias voltage to a gate electrode of at least one other MOS transistor in said MOS IC to operate said transistor at the zero temperature coefficient point.

2. A method of biasing an MOS IC as in claim 1, wherein said two MOS transistors are maintained at different temperatures by locally heating a portion of said MOS IC containing only one of said two MOS transistors.

3. A method of biasing an MOS IC as in claim 2, wherein said local heating is provided by applying a voltage to a resistor located in said portion of the MOS IC containing said one MOS transistor.

4. A method of biasing an MOS IC as in claim 1, wherein said bias voltage is generated as a function of the difference between the output voltages of said two MOS transistors by applying said output voltages to differential inputs of an amplifier and obtaining said bias voltage from an output of said amplifier.

\* \* \* \* \*